(12) United States Patent
Guo et al.

(10) Patent No.: US 11,854,589 B2
(45) Date of Patent: Dec. 26, 2023

(54) STT-SOT HYBRID MAGNETORESISTIVE ELEMENT AND MANUFACTURE THEREOF

(71) Applicants: Yimin Guo, San Jose, CA (US); Rongfu Xiao, Dublin, CA (US); Jun Chen, Fremont, CA (US)

(72) Inventors: Yimin Guo, San Jose, CA (US); Rongfu Xiao, Dublin, CA (US); Jun Chen, Fremont, CA (US)

( * ) Notice: Subject to any disclaimer, the term of this patent is extended or adjusted under 35 U.S.C. 154(b) by 209 days.

(21) Appl. No.: 17/509,014

(22) Filed: Oct. 24, 2021

(65) Prior Publication Data
US 2022/0044718 A1   Feb. 10, 2022

(51) Int. Cl.
| | | |
|---|---|---|
| *G11C 11/00* | (2006.01) | |
| *G11C 11/16* | (2006.01) | |
| *G11B 5/39* | (2006.01) | |
| *H01F 10/32* | (2006.01) | |
| *H10B 61/00* | (2023.01) | |
| *H10N 50/10* | (2023.01) | |
| *H10N 50/85* | (2023.01) | |
| *H10N 52/01* | (2023.01) | |
| *H10N 52/80* | (2023.01) | |

(52) U.S. Cl.
CPC .......... *G11C 11/161* (2013.01); *G11B 5/3909* (2013.01); *G11C 11/1675* (2013.01); *H01F 10/3286* (2013.01); *H10B 61/22* (2023.02); *H10N 50/10* (2023.02); *H10N 50/85* (2023.02); *H10N 52/01* (2023.02); *H10N 52/80* (2023.02)

(58) Field of Classification Search
CPC ... G11C 11/161; G11C 11/1675; G11C 11/18; G11C 11/1673; G11C 11/1659; G11C 11/14; G11C 11/16; H10N 50/01; H10N 50/10; H10N 50/80; H10N 50/85; H10N 52/01; H10N 52/80; H10N 52/00; H10N 70/801; H10N 52/101; H10N 59/00; H10N 70/826; H10B 61/22; H10B 61/20; H10B 61/00; H01F 10/329; H01F 10/3286; H01F 41/307; H01F 10/3254; H01F 41/302; H01F 41/34
See application file for complete search history.

(56) References Cited

U.S. PATENT DOCUMENTS

2020/0006631 A1\*  1/2020 Sato ............... G11C 11/161

\* cited by examiner

*Primary Examiner* — Thong Q Le

(57) ABSTRACT

A magnetoresistive element comprises a nonmagnetic sidewall-current-channel (SCC) structure provided on a surface of the SOT material layer that exhibits the Spin Hall Effect, which is opposite to a surface of the SOT material layer where the magnetic recording layer is provided, and comprising an insulating medium in a central region of the SCC structure, and a conductive medium being a sidewall of the SCC structure and surrounding the insulating medium, making an electric current crowding inside the SOT material layer and the magnetic recording layer to achieve a spin-orbit torque and a higher spin-polarization degree for an applied electric current.

20 Claims, 16 Drawing Sheets

The 1st Prior Art

The 2nd Prior Art

STT-SOT HYBRID MAGNETORESISTIVE ELEMENT AND MANUFACTURE THEREOF

CROSS-REFERENCE TO RELATED APPLICATIONS

This application is related to U.S. patent application Ser. No. 17/492,645 entitled A MAGNETORESISTIVE ELEMENT HAVING A SIDEWALL-CURRENT-CHANNEL STRUCTURE, filed Oct. 3, 2021, and incorporated herein by reference.

BACKGROUND OF THE INVENTION

1. Field of the Invention

This invention relates to the field of magnetoresistive elements. More specifically, the invention comprises a combined spin-transfer-torque (STT) and spin-orbit-torque (SOT) magnetic-random-access memory (MRAM) using magnetoresistive elements as basic memory cells which potentially replace the conventional semiconductor memory used in electronic chips, especially mobile chips for power saving and non-volatility as well as memory blocks in processor-in-memory (PIM).

2. Description of the Related Art

In recent years, magnetic random access memories (hereinafter referred to as MRAMs) using the magnetoresistive effect of ferromagnetic tunnel junctions (also called MTJs) have been drawing increasing attention as the next-generation solid-state nonvolatile memories that can cope with high-speed reading and writing, large capacities, and low-power-consumption operations. A ferromagnetic tunnel junction has a three-layer stack structure formed by stacking a recording layer having a changeable magnetization direction, an insulating spacing layer (also called tunnel barrier layer), and a fixed reference layer that is located on the opposite side from the recording layer and maintains a predetermined magnetization direction.

As a write method to be used in such magnetoresistive elements, there has been suggested a write method (spin torque transfer switching technique) using spin momentum transfers. According to this method, the magnetization direction of a recording layer is reversed by applying a spin-polarized current along a specific direction to the magnetoresistive element. Furthermore, as the volume of the magnetic layer forming the recording layer is smaller, the injected spin-polarized current to write or switch can be also smaller. Accordingly, this method is expected to be a write method that can achieve both device miniaturization and lower currents. However, since the magnetization direction of the recording layer in the planar-type MTJ is in the film plane, a high shape anisotropy or high magneto-crystalline anisotropy material need be used in order to keep a relatively high energy barrier to resist thermal fluctuation. Since the high shape anisotropy requires a high aspect ratio, it is clearly undesirable due to the fact it prevents scalability and high density memory. There is a one technique proposed by J. Wang (see U.S. Pat. No. 7,981,697) that a composite recording layer comprises high magneto-crystalline anisotropy materials in a tri-layered exchange-spring structure: a first magnetic layer/a magnetic nano-current-channel (NCC) layer/a second magnetic layer, and local magnetic moments in the magnetic NCC layer switch the state of the memory element in reversal modes of exchange-spring magnets, which leads to a reduced switching current without scarifying the device thermal stability.

Further, as in a so-called perpendicular MTJ element, both two magnetization films have easy axis of magnetization in a direction perpendicular to the film plane due to their strong perpendicular magnetic anisotropy induced by both interface interaction and crystalline structure (shape anisotropies are not used), and accordingly, the device shape can be made smaller than that of an in-plane magnetization type. Also, variance in the easy axis of magnetization can be made smaller. Accordingly, by using a material having a large perpendicular magnetic anisotropy, both miniaturization and lower currents can be expected to be achieved while a thermal disturbance resistance is maintained or the thermal stability factor, $E_b/k_BT$ ($E_b$ being the energy barrier between the two stable states of an MTJ cell, $k_B$ the Boltzmann constant, and T the absolute temperature), is maintained at a high value.

There has been a known technique for achieving a high MR ratio in a perpendicular MTJ element by forming an underneath MgO tunnel barrier layer and an MgO cap layer that sandwich a magnetic recording layer having a pair of amorphous CoFeB ferromagnetic layers and a Boron-absorbing layer positioned between them, and accelerate crystallization of the amorphous ferromagnetic film to match interfacial grain structure to MgO layers through a thermal annealing process. The magnetic recording layer crystallization starts from both the tunnel barrier layer side and the cap layer side to its center and forms a CoFe grain structure having a perpendicular magnetic anisotropy, as Boron elements migrate into the Boron-absorbing layer. Accordingly, a coherent perpendicular magnetic tunneling junction structure is formed. By using this technique, a high MR ratio can be achieved.

However, when an MTJ CD size is reduced to meet needs of very advanced and small-dimension technology nodes, both the MgO tunnel barrier layer and the MgO cap layer need to be thinner to keep a reasonable MTJ resistance. Note that the resistance property of layered materials is normally described by a resistance-area product (RA), which is product of resistance and area of a film layer. Therefore, it becomes more difficult to achieve both a high perpendicular magnetic anisotropy in a magnetic recording layer and a high MR ratio in an MTJ element in order to maintain a good thermal stability and read/write performance. A thick Boron-absorbing layer may help improve the perpendicular magnetic anisotropy in the recording layer. But, the damping constant of the recording layer may also increase from the thick Boron-absorbing layer material diffusion during the heat treatment in the device manufacturing process. At the same time, the CoFeB material in a magnetic recording layer has to be thin enough (normally between 1.0 nm and 2.0 nm) so that its magnetization is thermally stable in both perpendicular directions due to the limited value of its perpendicular magnetic anisotropy. Such a thin CoFeB material would be not capable to provide the highest spin polarization degree and the highest MR ratio which could be possibly achieved for a thick CoFeB material used in a planar MTJ element, thus limiting its potential for applications that need ultra-fast read speeds.

In a spin-injection perpendicular MRAM (or perpendicular spin-transfer-torque MRAM, i.e., pSTT-MRAM), a write current is proportional to both the damping constant and the energy barrier, and inversely proportional to a spin polarization degree. In general, the higher the write current, the faster the write process will complete. Ideally, a write process time of a few nanoseconds is required for high performance memories. However, a high write current of several hundred µA is typically required to flip that magnetization which is a major challenge for the establishment of pSTT-based storage devices in universal memories. But higher write current may accelerate the wear-out of the MTJ—particularly for perpendicular spin-transfer torque magnetic random-access memory (pSTT-MRAM), where the write current goes through the MTJ. Therefore, it is desired to develop new technologies to greatly enhance write efficiency or perpendicular spin-torque transfer efficiency while keeping a high MR ratio and thermal stability. An alternative way for switching the recording layer is by using an in-plane current-induced spin-orbit torque (SOT) generated at the interface between the recording layer and an SOT layer that exhibits the Spin-Hall Effect. In the three-terminal SOT-induced magnetization switching, the large write current does not pass through the tunnel barrier and thus the reliability and endurance are highly improved compared to STT switching. Due to an additional select transistor and a horizontally extended SOT layer, such a three-terminal design of SOT-MRAM requires a much larger device size than a simple two-terminal design of pSTT-MRAM.

There is a very different technique proposed by N. Sato, et al., (see Article: "Two-terminal spin-orbit torque magnetoresistive random access memory," *Nature Electronics* 1, 508-511, 2018) that utilizes a combined STT-SOT structure with a perpendicularly magnetized CoFeB free layer may lead to a low write current. In this structure, the magnetic tunnel junction is top-pinned, i.e., a magnetically pinned reference layer is on top of a tunnel barrier that is on top of a magnetic recording layer, and there is an SOT layer underneath the magnetic recording layer and further extending along one direction to connect a bottom electrode. Further, the magnetization switching behavior of perpendicularly magnetized CoFeB based free layers has been investigated by S. Pathak, et al., (see Article: "Impact of Spin-Orbit Torque on Spin-Transfer Torque Switching in Magnetic Tunnel Junctions," *Scientific Reports*, volume 10, Article number: 2799, 2020), and it has been discovered that a substantial improvement of both switching speed and energy consumption in a perpendicular magnetic tunnel junction could be achieved, even with a very tiny amplitude of SOT assisting to reduce the critical current density for switching of the magnetic recording layer. However, such a design still requires a large device size due to a horizontally extended SOT layer, a complicated integration process and a high manufacturing cost.

BRIEF SUMMARY OF THE PRESENT INVENTION

The present invention comprises STT-SOT hybrid perpendicular magnetoresistive elements having a sidewall-current-channel (SCC) structure and methods of manufacturing such perpendicular magnetoresistive elements for perpendicular spin-transfer-torque MRAM.

The perpendicular magnetoresistive element in the invention is sandwiched between an upper electrode and a lower electrode of each MRAM memory unit cell, which also comprises a write circuit which bi-directionally supplies a spin polarized current to the magnetoresistive element and a select transistor electrically connected between the magnetoresistive element and the write circuit.

The perpendicular magnetoresistive element comprises: a bottom electrode; an MTJ stack provided on a top surface of the bottom electrode and comprising: a magnetic reference layer having magnetic anisotropy in a direction perpendicular to a film surface and having an invariable magnetization direction, a tunnel barrier layer provided on a top surface of the magnetic reference layer and a magnetic recording layer provided on a top surface of the tunnel barrier layer and having magnetic anisotropy in a direction perpendicular to a film surface and having a variable magnetization direction; a spin-orbit torque (SOT) material layer provided on a top surface of the MTJ stack and exhibiting the Spin Hall Effect; a sidewall-current-channel (SCC) structure provided on a top surface of the SOT material layer; a protective cap layer provided on a top surface of the SCC structure and a hard mask layer provided on a top surface of the protective cap layer, wherein the SCC structure comprises an insulating medium throughout the SCC thickness in a central region of the SCC structure, and a conductive medium being a vertical sidewall of the SCC structure and surrounding the insulating medium throughout the SCC thickness, the insulating medium comprises an insulating oxide or nitride material and has a higher resistance-area product than the tunnel barrier layer, the conductive medium comprises a metal or metal alloy or conductive metal nitride material and forms an electrically conductive path between the SOT material layer and the protective cap layer. Further, the SOT material layer has a sufficiently small sheet resistance compared to the magnetic recording layer so that an electric current crowding occurs in said SOT material layer and both spin-orbit torques and spin-transfer torques on the magnetization of the magnetic recording layer can be achieved while a spin-polarized current flows nearly uniformly across the magnetic tunnel junction.

A method of manufacturing such a perpendicular magnetoresistive element comprising: providing a bottom electrode; forming an MTJ stack over the bottom electrode wherein the MTJ stack comprises a magnetic reference layer, a tunnel barrier layer provided on a top surface of the magnetic reference layer and a magnetic recording layer provided on a top surface of the tunnel barrier layer; forming an SOT material layer over the MTJ stack; forming an insulating medium layer over the SOT material layer; forming a protective cap layer over the insulating medium layer, forming a hard mask layer over the protective cap layer and providing a method of patterning the perpendicular magnetoresistive element which comprises: conducting a photolithographic process to form a patterned hard mask having an opening exposed area on the protective cap layer; first etching the protective cap layer and the insulating medium layer not covered by the patterned hard mask; forming a conductive encapsulation layer on the top surface of the patterned hard mask, on the top surface of the etched insulating medium layer and on vertical sidewalls of the insulating medium layer, the protective cap layer and the hard mask layer, wherein the conductive encapsulation layer comprises a metal or metal alloy or conductive metal nitride material; second etching away the conductive encapsulation layer on horizontal surfaces leaving the conductive encapsulation layer on sidewalls of the insulating medium layer, the protective cap layer and the hard mask layer, wherein vertical sidewalls of the insulating medium layer are fully covered by the conductive encapsulation layer forming a conductive medium electrically connecting the SOT material layer and the protective cap layer; third etching the SOT material layer and the MTJ stack to form a plurality of MTJ cells; forming a dielectric encapsulation layer on the top surface of the patterned hard mask and on sidewalls of the SOT material layer, the MTJ stack and the conductive encapsulation layer; refilling a dielectric layer; conducting a CMP process; forming a top electrode.

In a special case, the SOT material layer comprises Pt, PtAu, PtPd, or other noble metal or noble metal alloy having a thickness between 15 Angstroms and 60 Angstroms, and the insulating medium of the SCC structure comprises an MgO layer having a thickness of at least 12 Angstroms and being made by either RF deposition of MgO or Mg deposition under O2 exposure (reactive-oxidation), and the conductive sidewall of the SCC structure comprises a Ruthenium/Tungsten (or Tungsten Nitride) bi-layer having a wall thickness of at least 15 Angstroms. Here, and thereafter throughout this application, each element written in the left side of "/" is stacked below (or stacked earlier than) an element written in the right side thereof.

The perpendicular magnetoresistive element further comprises a bottom electrode and a top electrode. As a write voltage is applied between the bottom electrode and the top electrode, as a result of the SCC structure, the spin-polarized current flows perpendicularly from the magnetic reference layer across the tunnel barrier layer into the magnetic recording layer and the SOT material layer, and continues to flow inside the SOT material layer to its edge region where the conductive sidewall of the SCC structure contacts with, and finally flows through the conductive sidewall to the protective cap layer and the hard mask layer. The spin-polarized current density is relatively uniform across the tunnel barrier layer due to the facts that both the magnetic reference layer and the magnetic recording layer have a much higher conductivity than the tunnel barrier layer, and an electric current crowding through the vertical sidewall of the SCC structure occurs and the current flows in the film plane of the SOT material layer with a much longer distance than the thickness of the SOT material layer, which leads to a combined spin-transfer torque and spin-orbit torque acting on the magnetization of the magnetic recording layer. The spin-transfer torque has a vertical direction while the spin-orbit torque has an in-plane direction, which together causes an easy and/or fast magnetic domain reversal in the magnetic recording layer. Correspondingly, the critical write current and write power are reduced. The perpendicular magnetoresistive element may comprise an assisting magnetic layer between the SOT material layer and the SCC structure for further write power reduction.

DETAILED DESCRIPTION OF THE INVENTION

In general, according to one embodiment, there is provided a magnetoresistive element comprising:
- a magnetic reference layer having a perpendicular magnetic anisotropy and having an invariable magnetization direction;
- a tunnel barrier layer provided on the magnetic reference layer;
- a magnetic recording layer provided on the tunnel barrier layer and having a perpendicular magnetic anisotropy and a variable magnetization direction;
- an SOT material layer provided on the magnetic recording layer;
- a sidewall-current-channel (SCC) structure provided on the SOT material layer;
- a protective cap layer provided on the SCC structure; and
- a hard mask layer provided on the protective cap layer, comprising a buffer layer and a photoresist layer for further photo-lithographic processes of a magnetoresistive element;
- wherein the SCC structure comprises an insulating medium throughout the SCC thickness in a central region of the SCC structure, and a conductive medium surrounding the insulating medium and being a sidewall of the SCC structure, the insulating medium comprises an insulating oxide or nitride material and has a higher resistance-area product than the tunnel barrier layer, the conductive medium comprises a metal or metal alloy or conductive metal nitride material and forms an electrically conductive path between the SOT material layer and the protective cap layer.

Figure 1A:
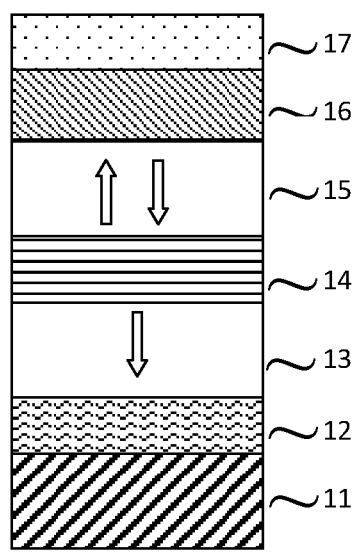
FIG. 1A is a cross-sectional view showing a schematic configuration of an MTJ element 1A as a first prior art.

FIG. 1A is a cross-sectional view showing a schematic configuration of an MTJ element 1A as a first prior art. As a typical perpendicular magnetic tunnel junction, the MTJ element 1A is configured by stacking a bottom electrode 11, a seed layer 12, a reference layer 13, a tunnel barrier layer 14, a recording layer 15, a cap layer 16, and a protective layer 17 in this order from the bottom.

Both the reference layer 13 and the recording layer 15 are made of ferromagnetic materials, and have uni-axial magnetic anisotropy in a direction perpendicular to a film surface. Further, both directions of easy magnetizations of the reference layer 13 and the recording layer 15 are also perpendicular to the film surfaces. A direction of easy magnetization is a direction in which the internal magnetic energy is at its minimum where no external magnetic field exists. Meanwhile, a direction of hard magnetization is a direction which the internal energy is at its maximum where no external magnetic field exists. The tunnel barrier layer 14 is made of a non-magnetic insulating metal oxide. The recording layer 15 has a variable (reversible) magnetization direction, while the reference layer 13 has an invariable (fixing) magnetization direction. The reference layer 13 is made of a ferromagnetic material having a perpendicular magnetic anisotropic energy which is sufficiently greater than the recording layer 15. This strong perpendicular magnetic anisotropy can be achieved by selecting a material, configuration and a film thickness. In this manner, a spin polarized current may only reverse the magnetization direction of the recording layer 15 while the magnetization direction of the reference layer 13 remains unchanged.

The cap layer 16 is a metal oxide layer having at least a thickness of 7 angstroms, which serves to introduce or improve perpendicular magnetic anisotropy of the recording layer 15. As an amorphous ferromagnetic material, like CoFeB, in the recording layer is thermally annealed, a crystallization process occurs to form bcc CoFe grains having epitaxial growth with (100) plane parallel to surface of the tunnel barrier layer and a perpendicular anisotropy is induced in the recording layer, as Boron elements migrate away the cap layer. Typically, the recording layer contains a metal insertion layer in the middle, which serves as a good absorber for the Boron elements in the recording layer to achieve better epitaxial CoFe crystal grains, and consequentially the recoding layer has a lower damping constant than the original CoFeB recording layer.

Figure 1B:
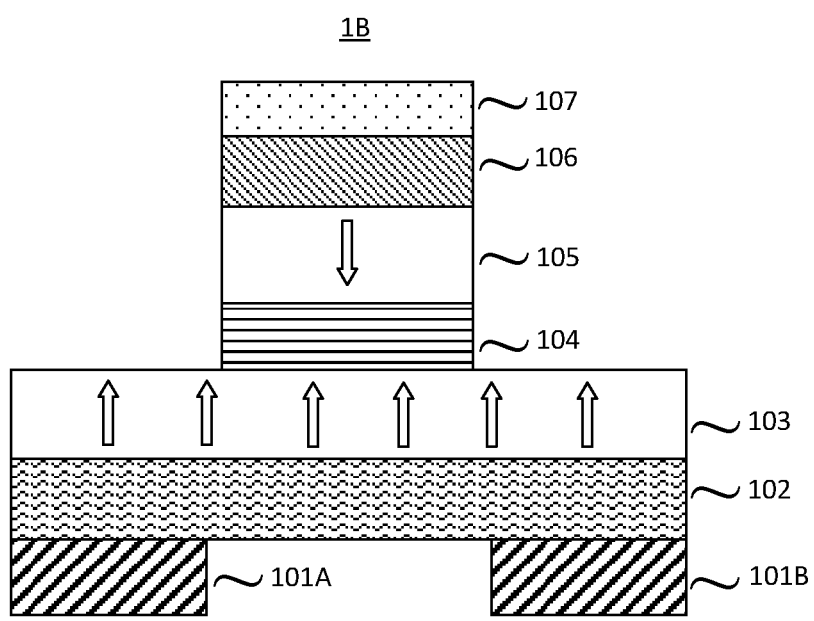
FIG. 1B is a cross-sectional view showing a schematic configuration of an MTJ element 1B as a second prior art.

FIG. 1B is a cross-sectional view showing a schematic configuration of an MTJ element 1B as a second prior art. As a conventional SOT magnetic tunnel junction, the MTJ element 1B comprises two bottom electrodes 101(A, B), an SOT material layer 102, a recording layer 103, a tunnel barrier layer 104, a reference layer 105, a cap layer 106, and a protective layer 107 in this order from the bottom. The magnetization direction distribution in the recording layer is illustrated by arrows shown in FIG. 1B. In this structure, the magnetization of the recording layer can be reversed by applying an electric current between the two bottom electrodes and along a specific direction in the SOT material layer film plane, in which a spin-orbit torque is used for the writing process. Alternatively, the magnetization of the recording layer can also be reversed by applying an electric current between the top electrode and one of bottom electrodes, in which both a spin-orbit torque and a spin-transfer torque are combined to switch the magnetization direction of the recording layer.

First Embodiment

Figure 2A:
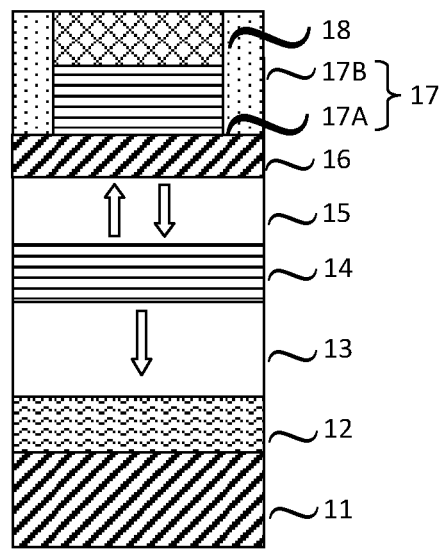
FIG. 2A is a cross-sectional view showing a schematic configuration of an MTJ element 20 having an SOT material layer and an SCC structure, according to the first embodiment of this invention.
Figure 2B:
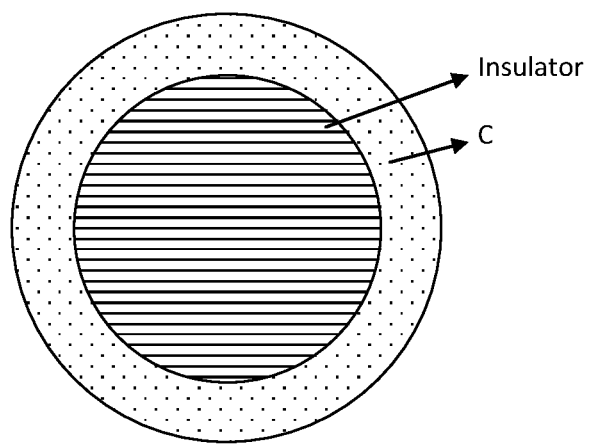
FIG. 2B is a schematic top view diagram of one SCC structure in an MTJ element of this invention.
Figure 2C:
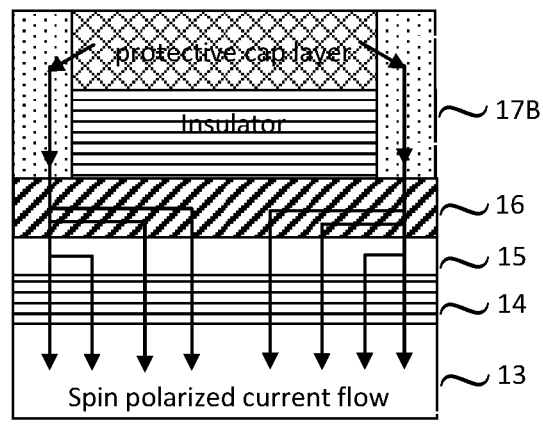
FIG. 2C is a schematic cross-sectional view diagram of spin-polarized current flow across the SCC structure, the SOT material layer and the MTJ stack in an MTJ element of this invention.

FIG. 2A is a cross-sectional view showing a schematic configuration of an MTJ element 20A having an SOT material layer and an SCC structure according to the first embodiment of this invention. The MTJ element 20A is configured by stacking a bottom electrode 11, a seed layer 12, a magnetic reference layer 13, a tunnel barrier layer 14, a magnetic recording layer 15, an SOT material layer 16, a sidewall-current-channel (SCC) structure 17 comprising an insulating medium 17A in a central region and a conductive medium 17B being a vertical sidewall surrounding the insulating medium 17A, and a protective cap layer 18 in this order from the bottom. FIG. 2B is a schematic top view diagram of a region of the SCC structure 17. Further, FIG. 2C is a schematic cross-sectional view diagram of spin-polarized current flow across the SCC structure, the SOT material layer and the MTJ stack in the first embodiment of this invention.

Being similar to the first prior art, the magnetic reference layer 13 and the magnetic recording layer 15 are made of ferromagnetic materials, and have uni-axial magnetic anisotropy in a direction perpendicular to a film surface. Directions of easy magnetizations of the magnetic reference layer 13 and the magnetic recording layer 15 are also perpendicular to the film surfaces. In another word, the MTJ element 20 is a perpendicular MTJ element in which magnetization directions of the magnetic reference layer 13 and the magnetic recording layer 15 face in directions perpendicular to the film surfaces. Also the tunnel barrier layer 14 is made of a non-magnetic insulating metal oxide.

The magnetic recording layer 15 has a variable (reversible) magnetization direction, while the magnetic reference layer 13 has an invariable (fixing) magnetization direction. The magnetic reference layer 13 is made of a ferromagnetic material having a perpendicular magnetic anisotropic energy which is sufficiently greater than the magnetic recording layer 15. This strong perpendicular magnetic anisotropy can be achieved by selecting a material, configuration and a film thickness. In this manner, a spin polarized current may only reverse the magnetization direction of the magnetic recording layer 15 while the magnetization direction of the reference layer 13 remains unchanged.

The SCC structure 17 comprises an insulating medium 17A of cylindrical or oval prism or other prism shapes throughout the SCC structure thickness and surrounded by a conductive medium 17B (as shown by dotted patterns of the SCC structure 17 in FIG. 2A, FIG. 2B and FIG. 2C) of sidewalls throughout the SCC structure thickness. The conductive medium 17B may directly contact with the SOT material layer 16, or may be separated from the SOT material layer 16 by a very thin insulating medium layer which has a much lower resistance-area product than the tunnel barrier layer 14 and the insulating medium 17A in the central region of the SCC structure. The SOT material layer 16 is made of a material which has a high Spin-Hall Angle or a high Spin-Hall Effect (SHE). The SOT material layer 16 is preferred to be highly conductive compared to the magnetic recording layer 15. Because the SOT material layer has a higher conductivity than the magnetic recording layer which has a much higher conductivity than the tunnel barrier layer, when a negative voltage is applied between the top electrode and the bottom electrode of the MTJ element, a current of electrons first passes through the sidewall conducting channel of the SCC structure into the edge region of the SOT material layer, and then a large portion of the electron current flows from the edge region of the SOT material layer to the central region of the SOT material layer, which is normally called current crowding effect. And finally the electron current approximately uniformly flows across the tunnel barrier layer when the characteristic length of the current crowding, which is defined as square-root of the ratio between the area-resistance product of the MTJ and the sheet resistance of the SOT material layer, is much larger than the radius (or half diameter) of the MTJ. When a positive voltage is applied between the top electrode and the bottom electrode, the flowing path of an electron current is simply reversed. The sheet resistance of the SOT material layer is the ratio between its resistivity (~60 micro-ohm·cm) and its thickness (~3 nm), which is estimated to be 200 ohms; while the sheet resistance of the magnetic recording layer is the ratio between its resistivity (~300 micro-ohm·cm) and its thickness (~1.5 nm), which is estimated to be 2000 ohms. If the area-resistance product of the MTJ is about 8 ohms-micron$^2$, the characteristic length of current crowding is more than 200 nm. For an advanced technology, the radius of the MTJ radius is getting smaller than 20 nm, so that the series resistance generated from the current crowding effect becomes negligible. In this invention, due to the current crowding effect, a majority of electric current is forced to flow along the film plane of the SOT material layer before it passes across the MTJ stack, and both a spin-orbit torque from the SOT material layer and a spin-transfer torque from the MTJ stack can be generated and combined to reverse the magnetization direction of the magnetic recording layer, i.e., the writing efficiency can be significantly improved.

In the SCC structure 17, as shown in FIG. 2B, "C" represents sidewall conducting channel (dotted pattern at periphery) which is highly conductive, while "Insulator" represents insulating medium (striped pattern in center) which is non-conductive or very poorly conductive. The sidewall conducting channel comprises a metal material or metal alloy material or conductive metal nitride material, which may have a high conductivity similar to the SOT material layer material or the protective cap layer material. The choice of the sidewall conducting channel material includes W, WN, Ru, Ta, TaN, Mo, MoN, TiN, etc. The sidewall conducting channel can be either a single layer or multilayer. The wall thickness of the sidewall conducting channel is preferred to be between 2 nm and 5 nm. The insulating medium consists of an oxide or a nitride, such as MgO, $Al_2O_3$, $SiO_2$, $SiN_x$, etc., having a larger thickness than the tunnel barrier layer 14, such that it has a much higher resistance-area product (RA) than the tunnel barrier layer 14. Note that the resistance of a metal oxide, such as MgO, $Al_2O_3$ etc., is typically an exponential function of its thickness, i.e., the resistance increases extremely fast with its thickness. In a ferromagnetic material, an internal magnetic field can generate a spin-polarized current because majority and minority carriers have different conductivities. Spin currents generated within ferromagnetic materials have spin directions that are aligned with the magnetization. An electric current obtains a spin polarization degree depending on the path length which free electrons are traveling inside a ferromagnetic material. The spin polarized current generated by a ferromagnetic layer can further transfer its spin angular momentum to another ferromagnetic layer within the same hetero-structure. FIG. 2C is a schematic cross-sectional view diagram of spin-polarized current flow across the SCC layer, the SOT material layer and the MTJ stack in an MTJ element of this invention. As the characteristic length of current crowding is much larger than the radius of the MTJ, the electric current mostly flows along the film plane of the SOT material layer and partly flows the film plane of the magnetic recording layer between the sidewall conducting channel and the tunnel barrier layer, in which electrons travel longer paths inside the magnetic recording layer than the film thickness of the magnetic recording layer, and obtains a higher spin-polarization degree than a simple Current-Perpendicular-to-Plane (CPP) mode in which a current of electrons passes only perpendicularly through the thickness of the magnetic recording layer. For an MgO MTJ, a moderate increase in the spin-polarization degree would lead to a greatly increased MR ratio. So, this invention provides a route of engineering spin-polarized electron flow and transfer through a magnetoresistive device.

The perpendicular magnetoresistive element 20A further comprises a bottom electrode and a top electrode (not shown here). As a write voltage is applied between the bottom electrode and the top electrode, as a result of above SCC structure, an inhomogeneous current distribution across the SOT material layer and the magnetic recording layer between the tunnel barrier layer and the SCC structure exists, and most of the electric current travels longer paths inside the SOT material layer which would cause a spin-orbit torque directly on the magnetization of the magnetic recording layer, and parts of the spin-polarized current travel longer paths inside the magnetic recording layer than the film thickness of the magnetic recording layer, which would cause a higher spin-transfer-torque efficiency. Since the magnetic recording layer has a similar magnetic moment and perpendicular magnetic anisotropies (PMAs) as a conventional pSTT-MRAM element which doesn't have the SCC structure, i.e., the energy barrier is similar, the critical switching current and switching time are expected to be smaller than a conventional pSTT-MRAM element due to the additional spin-orbit torque and the higher spin-transfer-torque efficiency in present invention, and correspondingly the write power is reduced.

An example configuration of the MTJ element 20 will be described below. The magnetic reference layer 13 is made of Pt (around 5 nm)/[Co/Pt]$_3$/Co (around 0.5 nm)/Ru(around 0.5 nm)/Co (around 0.5 nm)/W (around 0.2 nm)/CoFeB (around 1 nm). The tunnel barrier layer 14 is made of MgO (around 1 nm). The magnetic recording layer 15 is made of CoFeB (around 1.5 nm)/Mo (0.2 nm)/Co (around 0.6 nm). The SOT material layer 16 is made of Pt (around 3 nm). The insulating medium 17A of the SCC structure is made of MgO (around 1.5 nm), and the sidewall conductive medium 17B of the SCC structure is made of Ru/WN. The protective cap layer 18 is made of Ru/Ta (around 10 nm). The seed layer 12 is made of Ta (around 20 nm)/Ru(around 20 nm)/Ta (around 20 nm). Here, and thereafter throughout this application, each element written in the left side of "/" is stacked below (or stacked earlier than) an element written in the right side thereof.

Through schematic configurations after major fabrication steps in sequence, a detailed fabrication method of MTJ elements having an SOT material layer and an SCC structure in the first embodiment is illustrated in FIGS. 3(A, B, C, D, E, F) as follows. In general, a SCC structure can be formed by sequential steps comprising of: forming of the SOT material layer 16 on top surface of the recording layer 15, forming of the insulating medium 17A on top surface of the SOT material layer 16, forming of protective cap layer 17 on the insulating medium 16A, forming of the hard mask layer on the protective cap layer 18, performing a photolithographic process to form a patterned hard mask 19, etching away the protective cap layer and the insulating medium layer uncovered by the patterned hard mask 19, forming a highly conformal conductive encapsulation layer of a conductive medium, performing a vertically etching process to remove the conductive encapsulation layer on flat surfaces and leaving the conductive encapsulation layer 17B on sidewalls of the insulating medium layer 17A, the protective cap layer 18 and the hard mask 19, further etching the whole MTJ stack and forming a highly conformal dielectric encapsulation layer 20 of a dielectric material (i.e., an insulting material), as shown by schematic diagrams in FIGS. 3(A-F). FIG. 3A is a cross-sectional view showing a schematic configuration of an MTJ element 30 after using photolithographic process to form a patterned hard mask, according to the first embodiment. The MTJ element 30 is configured by stacking a bottom electrode 11, a seed layer 12, a magnetic reference layer 13, a tunnel barrier layer 14, a magnetic recording layer 15, an SOT material layer 16, an insulating medium 17A, a protective cap layer 18 and a patterned hard mask 19 in this order from the bottom. The insulating medium 17A is preferred to be MgO or other stable metal oxide having a thickness of at least 12 Angstroms and a resistance-area product of at least 50 ohms-micron$^2$. The formation of MgO comprises either RF deposition of MgO or Mg deposition under $O_2$ exposure (reactive-oxidation) and optionally post-annealed.

Figure 3A:
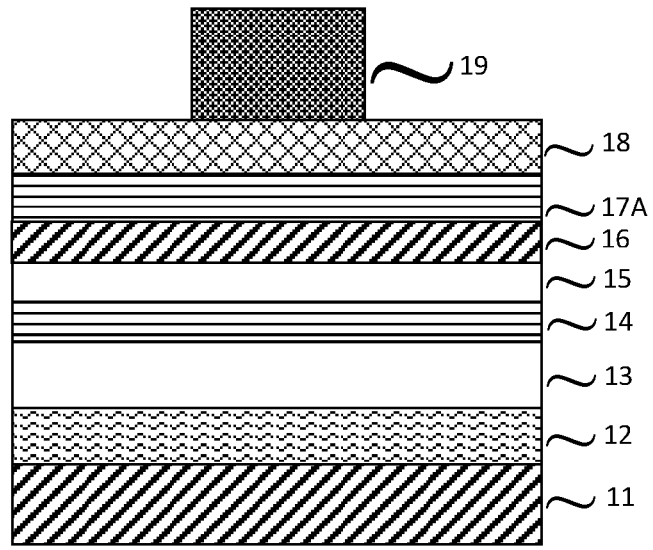
FIG. 3A is a cross-sectional view showing a schematic configuration of the photolithographic process to form a patterned hard mask, according to the first embodiment.
Figure 3B:
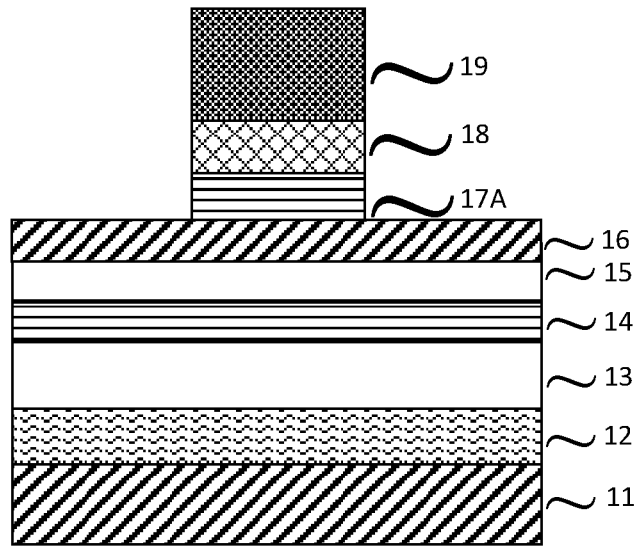
FIG. 3B is a cross-sectional view showing a schematic configuration after etching away the protective cap layer and the insulating medium layer uncovered by the patterned hard mask and stopping at the bottom of the insulating medium layer, according to the first embodiment.
Figure 3C:
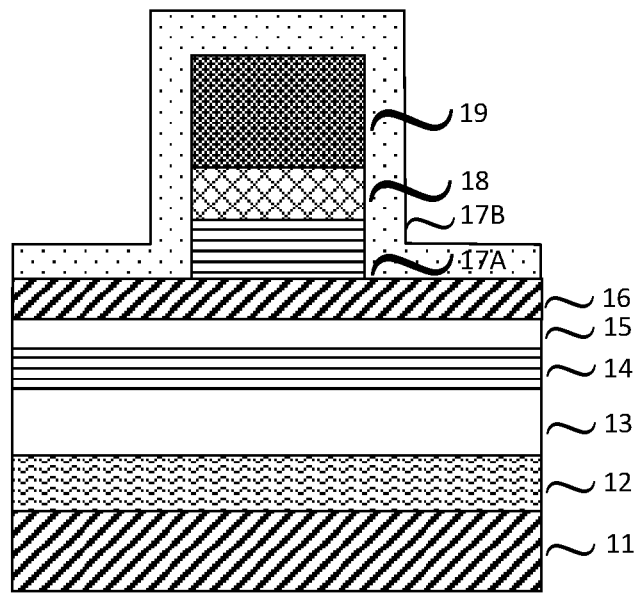
FIG. 3C is a cross-sectional view showing a schematic configuration of an MTJ element after depositing a highly conformal conductive encapsulation layer of a conductive medium by PE-CVD or atomic-layer-deposition process, according to the first embodiment.
Figure 3D:
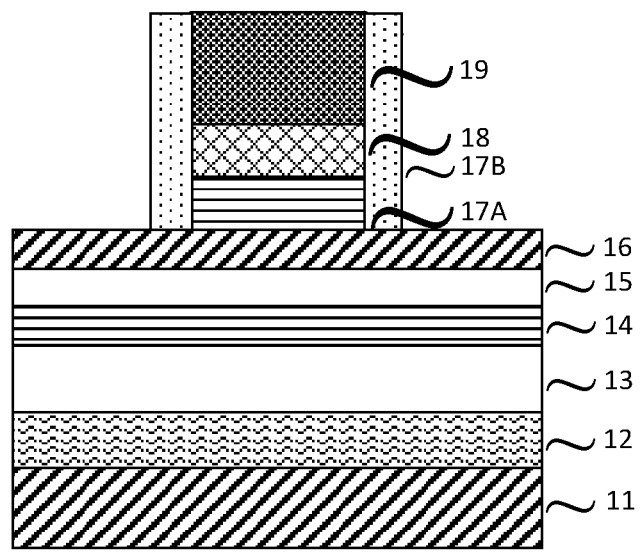
FIG. 3D is a cross-sectional view showing a schematic configuration of an MTJ element after vertically etching away the conductive encapsulation layer on flat surfaces, according to the first embodiment.

FIG. 3B is a cross-sectional view showing a schematic configuration after etching away the protective cap layer and the insulating medium layer uncovered by the patterned hard mask and stopping at the bottom surface of the insulating medium layer or stopping inside the SOT material layer. Even if the most part of the insulating medium uncovered by the patterned hard mask is etched away, remaining insulating medium is very thin (not shown here) and its resistance-area product is very small so that it becomes very conductive, while the insulating medium layer 17A covered by the patterned hard mask is untouched and has a very high resistance-area product. FIG. 3C is a cross-sectional view showing a schematic configuration of an MTJ element after depositing a highly conformal conductive encapsulation layer of a conductive medium by PE-CVD or atomic-layer-deposition process. Such a highly conformal conductive encapsulation layer 17B has about the same thickness on the wall and on the flat surface. The conductive encapsulation layer comprises at least one selected from the group consisting of a Ru layer, a W layer, a Ta layer, a Mo layer, a Hf layer, a WN layer, a TaN layer, a HfN layer, a TiN layer, a Fe layer, a CoFe layer, a CoFeB layer, etc. FIG. 3D is a cross-sectional view showing a schematic configuration of an MTJ element after vertically etching away the conductive encapsulation layer on flat surfaces and leaving the conductive encapsulation layer as the sidewall conductive channel 17B on sidewalls of the insulating medium layer 17A, the protective cap layer 18 and the hard mask 19.

Figure 3E:
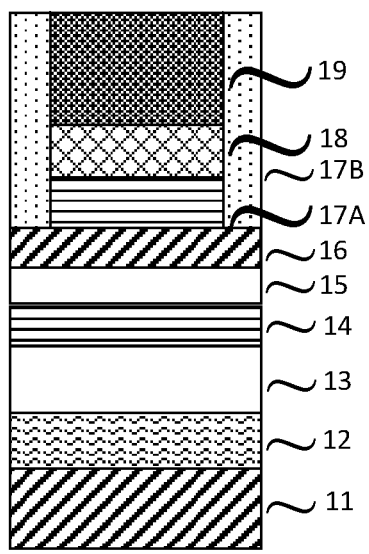
FIG. 3E is a cross-sectional view showing a schematic configuration of an MTJ element after etching the SOT material layer and the whole MTJ stack, according to the first embodiment.
Figure 3F:
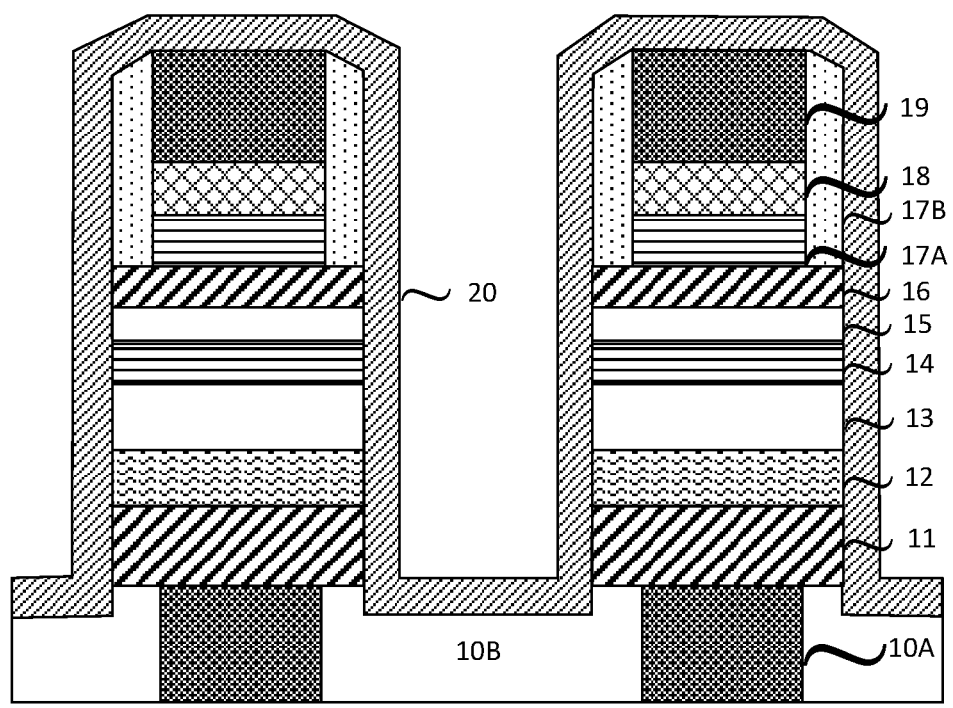
FIG. 3F is a cross-sectional view showing a schematic configuration of an MTJ array after depositing a highly conformal dielectric encapsulation layer of an insulting material by PE-CVD or atomic-layer-deposition process, according to the first embodiment.

FIG. 3E is a cross-sectional view showing a schematic configuration of an MTJ element 34 after etching the whole MTJ stack, including the bottom electrode. The MTJ element 34 is configured by stacking a bottom electrode 11, a seed layer 12, a magnetic reference layer 13, a tunnel barrier layer 14, a magnetic recording layer 15, an SOT material layer 16, insulating medium 17A, a sidewall conductive channel 17B, a protective cap layer 18 and a patterned hard mask 19 in this order from the bottom. And FIG. 3F is a cross-sectional view showing a schematic configuration of an MTJ array after depositing a highly conformal dielectric encapsulation layer 20 of a dielectric material by PE-CVD or atomic-layer-deposition process. A typical dielectric material is $SiN_x$ which would prevent oxidization of the MTJ from a dielectric oxide refilled in a MTJ pillar array in a later process. In FIG. 3F, 10A represents a bottom via, which connects the MTJ element to an underneath select transistor (not shown here), and 10B represents a dielectric material. The step of forming the conductive encapsulation layer is in-situ performed with the step of etching the insulating medium layer uncovered by the hard mask and the step of etching the conductive encapsulation layer on flat surfaces in a production tool having a vacuum environment, and wherein no vacuum-break occurs to the vacuum environment from a time the step of etching the insulating medium layer is started to a time the step of forming the dielectric encapsulation layer is ended. After the dielectric encapsulation process, a dielectric $SiO_2$ is refilled to cover the MTJ pillar array, followed by a CMP process, a top electrode connection process and a bit-line process, which are not shown here.

Second Embodiment

Figure 4:
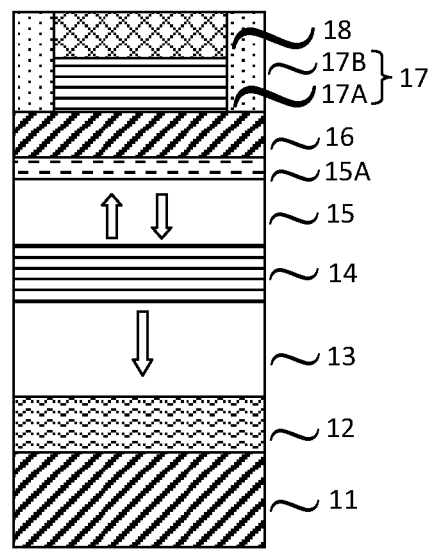
FIG. 4 is a cross-sectional view showing a schematic configuration of an MTJ element 40 having an SOT material layer and an SCC structure, according to the second embodiment.

FIG. 4 is a cross-sectional view showing a schematic configuration of an MTJ element 40 having a SCC structure according to the second embodiment of this invention. The MTJ element 40 is configured by stacking a bottom electrode 11, a seed layer 12, a magnetic reference layer 13, a tunnel barrier layer 14, a magnetic recording layer 15, a performance enhancement layer 15A, an SOT material layer 16, a nonmagnetic sidewall-current-channel (SCC) structure 17 comprising an insulating medium 17A and a conductive medium 17B being a sidewall surrounding the insulating medium 17A, and a protective cap layer 18 in this order from the bottom.

Being similar to the first prior art, the magnetic reference layer 13 and the magnetic recording layer 15 are made of ferromagnetic materials, and have uni-axial magnetic anisotropy in a direction perpendicular to a film surface. Directions of easy magnetizations of the magnetic reference layer 13 and the magnetic recording layer 15 are also perpendicular to the film surfaces. In another word, the MTJ element 40 is a perpendicular MTJ element in which magnetization directions of the magnetic reference layer 13 and the magnetic recording layer 15 face in directions perpendicular to the film surfaces. Also the tunnel barrier layer 14 is made of a non-magnetic insulating metal oxide. The magnetic recording layer 15 has a variable (reversible) magnetization direction, while the magnetic reference layer 13 has an invariable (fixing) magnetization direction. The magnetic reference layer 13 is made of a ferromagnetic material having a perpendicular magnetic anisotropic energy which is sufficiently greater than the magnetic recording layer 15. This strong perpendicular magnetic anisotropy can be achieved by selecting a material, configuration and a film thickness. In this manner, a spin polarized current may only reverse the magnetization direction of the magnetic recording layer 15 while the magnetization direction of the reference layer 13 remains unchanged.

The SCC structure 17 comprises an insulating medium 17A of cylindrical or oval prism or other prism shapes throughout the SCC structure thickness and surrounded by a conductive medium or sidewall 17B throughout the SCC structure thickness. The conductive sidewall 17B directly contacts with the SOT material layer 16 which is highly conductive. Because the SOT material layer has a much higher conductivity than the performance enhancement layer 15A and the magnetic recording layer 15 which has a much higher conductivity than the tunnel barrier layer 14, when a negative voltage is applied between the top electrode and the bottom electrode of the MTJ element, a current of electrons first passes through the sidewall conducting channel of the SCC structure into the edge region of the SOT material layer 16, and then a large portion of the electron current flows from the edge region of the SOT material layer to the central region of the SOT material layer, due to current crowding effect. And also a small part of the spin-polarized current may flow from the edge region of the magnetic recording layer 15 to the central region of the magnetic recording layer 15. Finally, the spin-polarized current approximately flows across the tunnel barrier layer 14 when the characteristic length of the current crowding in the SOT material layer 16 and the magnetic recording layer 15 is much larger than the radius (or half diameter) of the MTJ stack. The performance enhancement layer 15A may comprise a very thin layer of a material which improves the perpendicular anisotropy of the magnetic recording layer 15, and/or enhances the Spin-Hall Effect between the SOT material layer 16 and the magnetic recording layer 15. The performance enhancement layer 15A comprises at least one layer of Ru, Mg, Mo, W, Ta, Ti, Cr, V, Hf, Nb, Zr, Fe, Co, Ni, Al, Cu, Pt, Au, Ag, Rh, Ir, Os, Re, or alloy thereof, or oxide thereof.

Being similar to the first embodiment, the sidewall conducting channel is highly conductive, while the insulating medium is non-conductive or very poorly conductive. The sidewall conducting channel comprises a nonmagnetic metal material or metal alloy material or metal nitride material, which may have a high conductivity similar to the magnetic recording layer material or the protective cap layer material. The choice of the sidewall conducting channel material includes W, WN, Ru, Ta, TaN, Mo, MoN, TiN, etc. The sidewall conducting channel 17B can be either a single layer or multilayer. The width of the sidewall conducting channel is preferred to be between 2 nm and 5 nm. The insulating medium 17A consists of an oxide or a nitride, such as MgO, $Al_2O_3$, $SiO_2$, $SiN_x$, etc., having a larger thickness than the tunnel barrier layer 14, such that it has a much higher resistance-area product (RA) than the tunnel barrier layer 14. Note that the resistance of a metal oxide, such as MgO, $Al_2O_3$ etc., is typically an exponential function of its thickness, i.e., the resistance increases extremely fast with its thickness.

An example configuration of the MTJ element 40 will be described below. The magnetic reference layer 13 is made of MgO/FeO/[Fe/Pt]$_5$/Fe/Cr/Fe/CoFe(around 1 nm). The tunnel barrier layer 14 is made of MgO (around 1 nm). The magnetic recording layer 15 is made of Fe/CoFeB (around 1.4 nm). The SOT material 16 is made of PtPd(around 4 nm). The performance enhancement layer 15A is made of a multilayer Co (0.2 nm)/Pt (0.2 nm). The insulating medium 17A of the SCC structure 17 is made of MgO (around 2 nm), and the sidewall conductive medium 17B of the SCC structure 17 is made of Mo/Ru/WN. The protective cap layer 18 is made of Ru/Ta (around 10 nm). The seed layer 12 is made of Ta (around 20 nm)/Ru(around 20 nm)/Ta (around 20 nm). Detailed schematic configurations of MTJ elements having a SCC structure after each major fabrication step in sequence and their forming methods are illustrated in FIGS. 5(A, B, C, D, E, F) as follows.

Figure 5A:
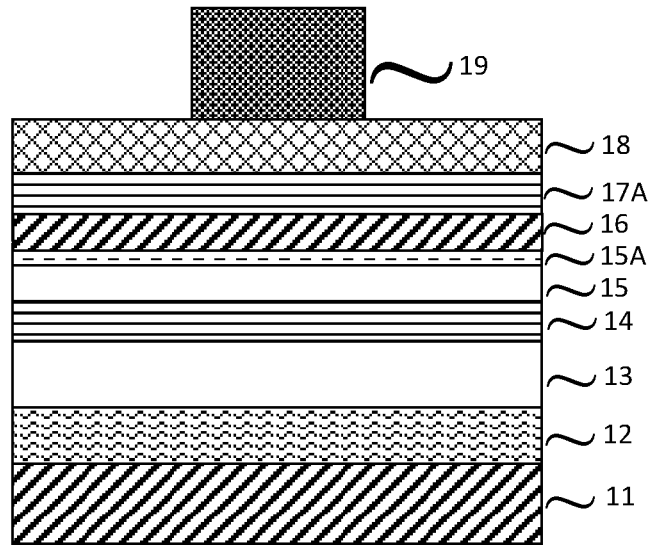
FIG. 5A is a cross-sectional view showing a schematic configuration of the photolithographic process to form a patterned hard mask, according to the second embodiment.

FIG. 5A is a cross-sectional view showing a schematic configuration of an MTJ element 50 after using photolithographic process to form a patterned hard mask, according to the first embodiment. The MTJ element 50 is configured by stacking a bottom electrode 11, a seed layer 12, a magnetic reference layer 13, a tunnel barrier layer 14, a magnetic recording layer 15, a performance enhancement layer 15A, an SOT material layer 16, an insulating medium 17A, a protective cap layer 18 and a patterned hard mask 19 in this order from the bottom. The MTJ has a resistance-area product of 5 ohms-micron$^2$. The insulating medium 17A is preferred to be MgO or other stable metal oxide having a thickness of at least 12 Angstroms and a resistance-area product of at least 100 ohms-micron$^2$.

Figure 5B:
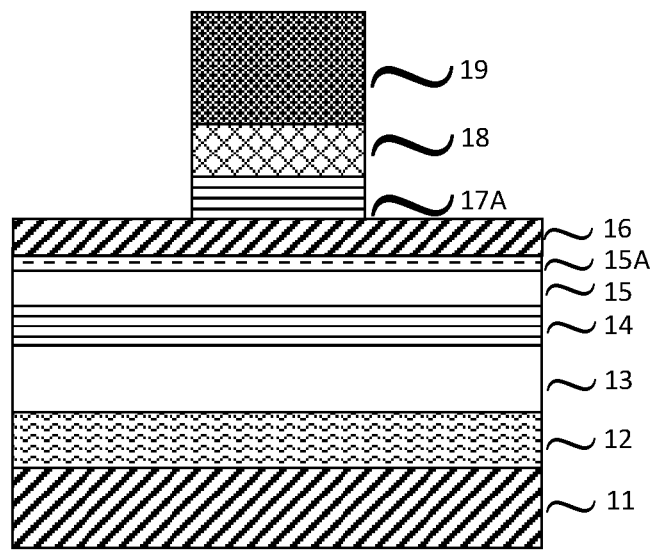
FIG. 5B is a cross-sectional view showing a schematic configuration after etching away the protective cap layer and the insulating medium layer uncovered by the patterned hard mask and stopping at the bottom of the insulating medium layer, according to the second embodiment.
Figure 5C:
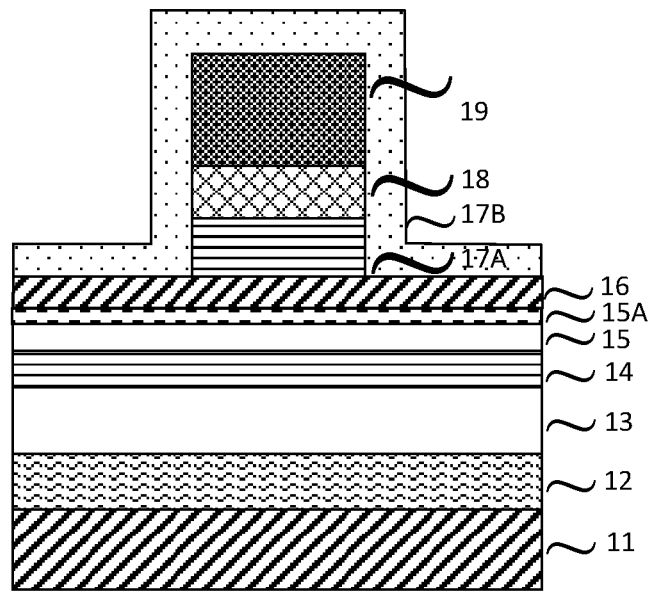
FIG. 5C is a cross-sectional view showing a schematic configuration of an MTJ element after depositing a highly conformal conductive encapsulation layer of a conductive medium by PE-CVD or atomic-layer-deposition process, according to the second embodiment.
Figure 5D:
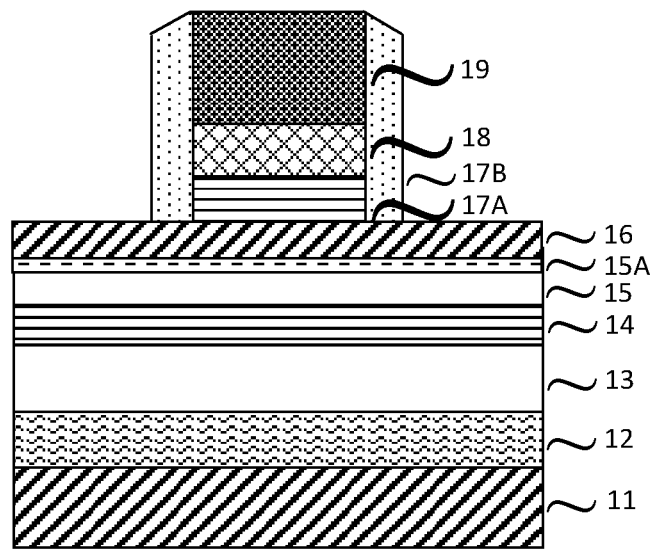
FIG. 5D is a cross-sectional view showing a schematic configuration of an MTJ element after vertically etching away the conductive encapsulation layer on flat surfaces, according to the second embodiment.

FIG. 5B is a cross-sectional view showing a schematic configuration after etching away the protective cap layer and the insulating medium layer uncovered by the patterned hard mask and stopping at the bottom of the insulating medium layer or stopping inside the SOT material layer. FIG. 5C is a cross-sectional view showing a schematic configuration of an MTJ element after depositing a highly conformal conductive encapsulation layer of a conductive medium by PE-CVD or atomic-layer-deposition process. Such a highly conformal conductive encapsulation layer has about the same thickness on the wall and on the flat surface. The conductive encapsulation layer comprises at least one selected from the group consisting of a Ru layer, a W layer, a Ta layer, a Mo layer, a Hf layer, a WN layer, a TaN layer, a HfN layer, a TiN layer, a Fe layer, a CoFe layer, a CoFeB layer, etc. After forming the conductive encapsulation layer, a sacrificial encapsulation layer of a dielectric material, such as $SiN_x$, is deposited. Here, the sacrificial encapsulation layer would serve to better control the final wall thickness of the conductive encapsulation layer on walls of the insulating layer, the protective layer and the hard mask layer without significant etching from future etching processes which may only etch away the sacrificial encapsulation layer. FIG. 5D is a cross-sectional view showing a schematic configuration of an MTJ element after vertically etching away the conductive encapsulation layer on flat surfaces and leaving the conductive encapsulation layer 17B on sidewalls of the insulating medium layer 17A, the protective cap layer 18 and the hard mask 19.

Figure 5E:
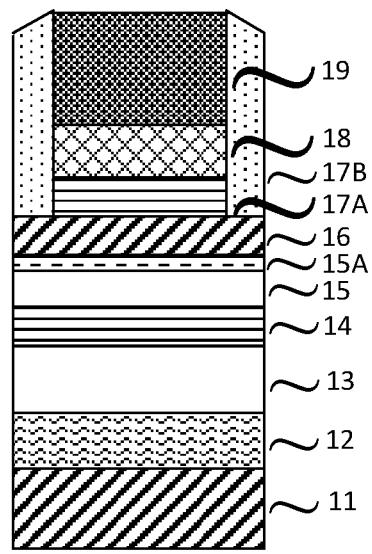
FIG. 5E is a cross-sectional view showing a schematic configuration of an MTJ element after etching the SOT material layer and the whole MTJ stack, according to the second embodiment.
Figure 5F:
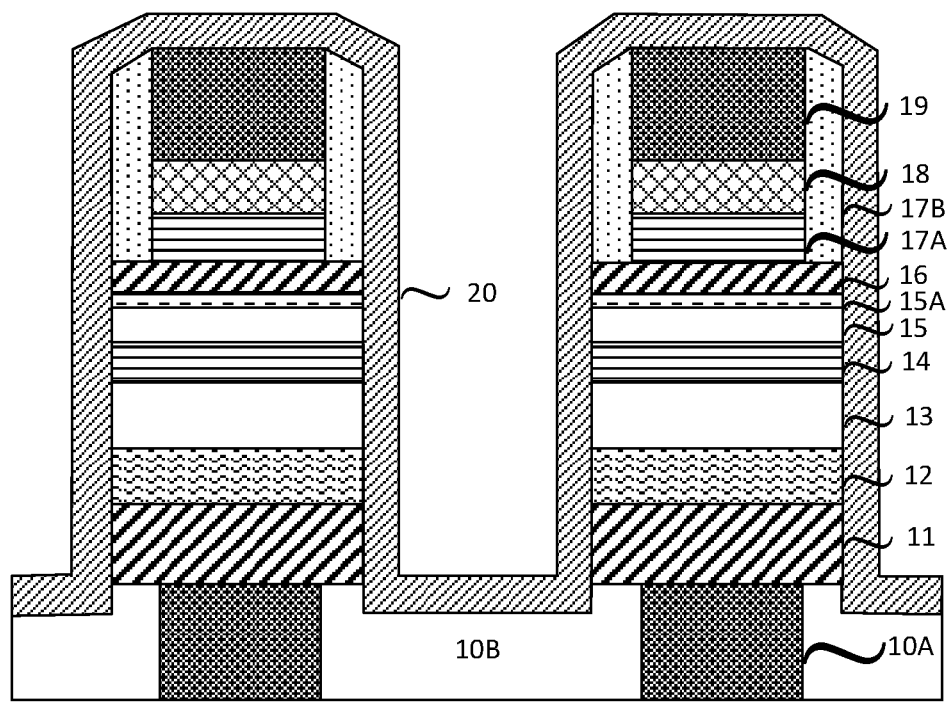
FIG. 5F is a cross-sectional view showing a schematic configuration of an MTJ array after depositing a highly conformal dielectric encapsulation layer of an insulting material by PE-CVD or atomic-layer-deposition process, according to the second embodiment.

FIG. 5E is a cross-sectional view showing a schematic configuration of an MTJ element after etching the SOT material layer, the whole MTJ stack, including the bottom electrode. And FIG. 5F is a cross-sectional view showing a schematic configuration of an MTJ array after depositing a highly conformal dielectric encapsulation layer 20 of a dielectric material (i.e., an insulting material) by PE-CVD or atomic-layer-deposition process. A typical dielectric material is $SiN_x$ which would prevent oxidization of the MTJ from a dielectric oxide refilled in a MTJ pillar array. In FIG. 5F, 10A represents a bottom via, which connects the MTJ element to an underneath select transistor, and 10B represents a dielectric material. After the dielectric encapsulation process, a dielectric $SiO_2$ is refilled to cover the MTJ pillar array, followed by a CMP process, a top electrode connection process and a bit-line process, which are not shown here.

Third Embodiment

Figure 6:
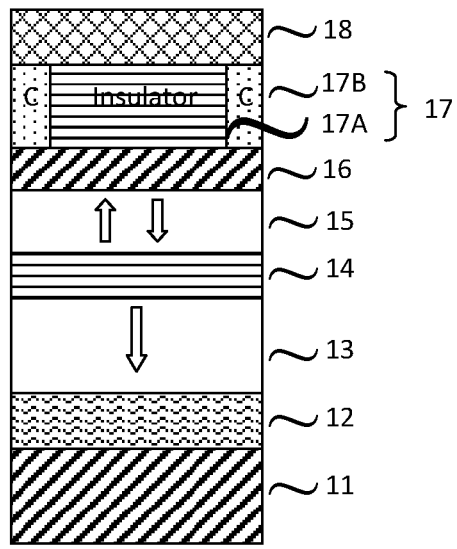
FIG. 6 is a cross-sectional view showing a schematic configuration of an MTJ element 60 having an SOT material layer and an SCC structure, according to the third embodiment.

FIG. 6 is a cross-sectional view showing a deposition processing of an alternative SCC structure, according to the third embodiment of this invention. The MTJ element 60 is configured by stacking a bottom electrode 11, a seed layer 12, a magnetic reference layer 13, a tunnel barrier layer 14, a magnetic recording layer 15, an SOT material layer 16, a sidewall-current-channel (SCC) structure 17 comprising an insulating medium 17A and a conductive medium 17B being a sidewall surrounding the insulating medium 17A, and a protective cap layer 18 in this order from the bottom. Unlike the first and second embodiments, this alternative SCC structure has a side conductive wall only surrounding the insulating medium, instead of extending all the way to surround the hard mask. This can be achieved by using metal ion implantation to make the insulating medium's outside region conductive, i.e., producing the conductive medium 17B, after etching away the protective cap layer 18 and the insulating medium layer 17A uncovered by a patterned hard mask (not shown here) and stopping at the bottom of the insulating medium layer.

Fourth Embodiment

Figure 7:
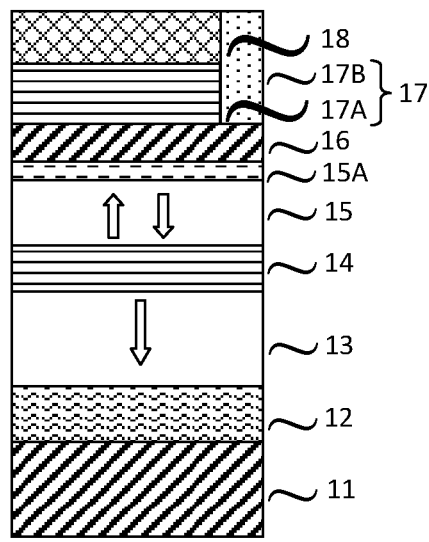
FIG. 7 is a cross-sectional view showing a schematic configuration of an MTJ element 70 having an SOT material layer and an SCC structure, according to the fourth embodiment.

As the fourth embodiment shown in FIG. 7, the MTJ element 70 is configured by stacking a bottom electrode 11, a seed layer 12, a magnetic reference layer 13, a tunnel barrier layer 14, a magnetic recording layer 15, a perpendicular anisotropy enhancement layer 15A, an SOT material layer 16, a nonmagnetic sidewall-current-channel (SCC) structure 17 comprising an insulating medium 17A and a conductive medium 17B being a sidewall, and a protective cap layer 18 in this order from the bottom. Different from previous embodiments, the conductive sidewall 17B is only on one side of the element, which can be fabricated by either asymmetrically depositing the conductive medium or an additional canted etching of the conductive medium. In this structure, an electric current passes through the one-sided sidewall and also flows in-plane along the SOT material layer and the magnetic recording layer before nearly uniformly passing through the tunnel barrier layer to the magnetic reference layer.

All of above embodiments may further comprise an assisting magnetic layer provided in proximity of the magnetic recording layer, especially between the SCC structure and the cap layer. The assisting magnetic layer has a magnetization direction either in the film plane or perpendicular to the film surface, and may provide an additional spin-transfer-torque on the magnetic recording layer, or may provide a shielding effect to reduce stray demag field from the magnetic recording layer during the switching process. The assisting magnetic layer may comprise at least one of an iron (Fe) layer, a cobalt (Co) layer, an alloy layer of cobalt iron (CoFe), an alloy layer of iron boron (FeB), an alloy layer of cobalt boron (CoB), an alloy layer of cobalt iron boron (CoFeB), an alloy layer of cobalt nickel iron (CoNiFe), an alloy layer of cobalt nickel (CoNi), an alloy layer of iron platinum (FePt), an alloy layer of iron palladium (FePd), an alloy layer of iron nickel (FeNi), a laminated layer of $(Fe/Co)_n$, a laminated layer of $(Fe/CoFe)_n$, a laminated layer of $(Fe/Pt)_n$, a laminated layer of $(Fe/Pd)_n$ and a laminated layer of $(Fe/Ni)_n$, where n is a lamination number being at least 3, and the B composition percentage is no more than 35%. The assisting magnetic layer may be a multilayer of ferromagnetic materials.

Fifth Embodiment

Figure 8:
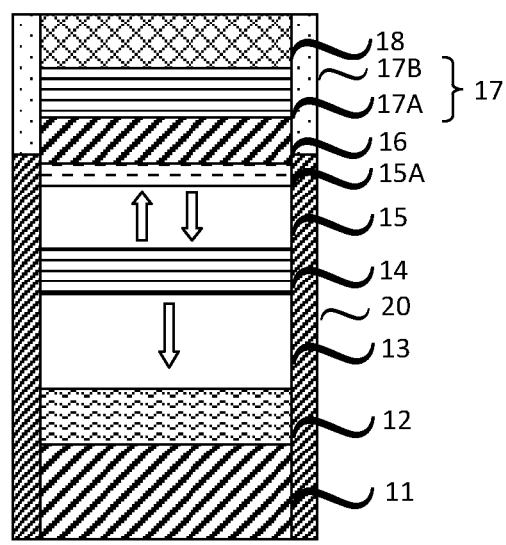
FIG. 8 is a cross-sectional view showing a schematic configuration of an MTJ element 80 having an SOT material layer and an SCC structure, according to the fifth embodiment.

As the fifth embodiment shown in FIG. 8, the MTJ element 80 is configured by stacking a bottom electrode 11, a seed layer 12, a magnetic reference layer 13, a tunnel barrier layer 14, a magnetic recording layer 15, a performance enhancement layer 15A, an SOT material layer 16, a sidewall-current-channel (SCC) structure 17 comprising an insulating medium 17A and a conductive medium 17B being a sidewall, a protective cap layer 18 and an insulating encapsulation layer 20. The conductive medium 17B electrically connects the protective cap layer 18 and the SOT material layer 16. The SOT material layer 16 has a sufficiently small sheet resistance so that an electric current crowding occurs in the SOT material layer due to the SCC structure while the current density across the tunnel barrier layer is substantially uniform when a voltage is applied to the MTJ element. Unlike previous embodiments, the outside diameter of the conductive medium 17B is larger than the MTJ diameter in the fifth embodiment. The SCC structure 17 can be formed by sequential steps comprising of: forming of the insulating medium 17A on top surface of the SOT material layer 16, forming of protective cap layer 18 on the insulating medium 17A, forming of the hard mask layer (not shown here) on the protective cap layer 18, performing a photolithographic process to form a patterned hard mask, first etching away the protective cap layer, the insulating medium layer, the SOT material layer, the performance enhancement layer and the whole MTJ stack uncovered by the patterned hard mask, forming a highly conformal insulating encapsulation layer 20, refilling a first dielectric material, performing a first CMP process to expose the patterned hard mask, performing a second etching process to remove the insulating encapsulation layer and the first dielectric material to expose about a half of the SOT material layer, forming a highly conformal conductive encapsulation layer 17B, performing a third etching process to remove the conductive encapsulation layer and stop inside the first dielectric material on flat surfaces and leaving the conductive encapsulation layer 17B on sidewalls of the SOT material layer, the insulating medium layer 17A, the protective cap layer 18 and the hard mask, refilling a second dielectric material, performing a second CMP process to expose the patterned hard mask, further forming a top electrode and a bit-line.

Sixth Embodiment

Figure 9:
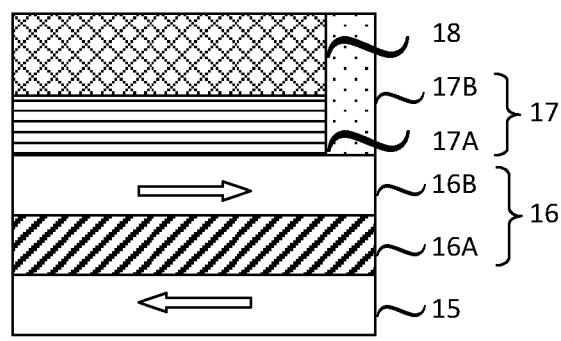
FIG. 9 is a cross-sectional view showing a schematic configuration of an MTJ element 90 having an SOT material layer, a soft adjacent layer and an SCC structure, according to the sixth embodiment.

An SCC structure can be also applied to an in-plane MTJ element magnetic random access memory (in-plane- MRAM) element. As the sixth embodiment shown in FIG. 9, an SOT structure 16 is provided over a magnetic recording layer 15, and the SOT structure 16 comprises an SOT material layer 16A and a soft-adjacent layer 16B. Further, a nonmagnetic sidewall-current-channel (SCC) structure 17 is provided over the SOT structure 16 and comprises an insulating medium 17A and a conductive medium 17B being a sidewall, and a protective cap layer 18 is provided over the insulating medium 17A. Both the magnetic recording layer 15 and the soft-adjacent layer 16B have in-plane magnetic anisotropies, and essentially in-plane magnetizations which form a stable flux-closure. The SOT material layer 16A has a sufficiently small sheet resistance than both the magnetic recording layer 15 and the soft-adjacent layer 16B so that an electric current crowding occurs in the SOT material layer 16A. The SOT material layer 16A exhibits the Spin Hall Effect and comprises one or more of Pt, Pd, Au, Ag, Cu, or alloys thereof, or alloys thereof being doped with Ta, W, Hf, Ir, Bi, Se or oxygen, or a noble metal being doped with Ta, W, Hf, Ir, Bi, Se or oxygen, or combinations thereof.

While certain embodiments have been described above, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetoresistive element having a sidewall-current-channel (SCC) structure and being used in a magnetic memory device, comprising:
    a magnetic reference layer having a perpendicular magnetic anisotropy and having an invariable magnetization direction;
    a tunnel barrier layer provided on the magnetic reference layer;
    a magnetic recording layer provided on the tunnel barrier layer and having a perpendicular magnetic anisotropy and a variable magnetization direction;
    an SOT material layer provided on the magnetic recording layer, wherein the SOT material layer comprises one or more materials that exhibit the Spin Hall Effect (SHE);
    the sidewall-current-channel (SCC) structure provided on the SOT material layer, the SCC structure comprising: an insulating medium disposed at least in a central region of the SCC structure and throughout the SCC structure thickness; and a conductive medium disposed on at least one vertical side of the insulating medium and throughout the SCC structure thickness, forming a vertical sidewall channel that at least partially surrounds the insulating medium;
    a protective cap layer provided on the insulating medium; and
    a hard mask layer provided on the protective cap layer;
    wherein the tunnel barrier layer has a first resistance-area product ($RA_1$), the insulating medium comprises an insulating oxide or nitride material and has a second resistance-area product ($RA_2$), the second resistance-area product ($RA_2$) is higher than the first resistance-area product ($RA_1$), the insulating medium comprises an electrically insulating material, the conductive medium comprises an electrically conductive material that provides electrical connection directly between the SOT material layer and the protective cap layer through the vertical sidewall channel.

2. The magnetoresistive element of claim 1, wherein said conductive medium further extends along a vertical direction to be vertical sidewalls of said protective cap layer and said hard mask layer.

3. The magnetoresistive element of claim 1, wherein said conductive medium comprises at least one layer of metal or metal alloy or conductive metal nitride material, preferred to be Ru, Mo, W, Ta, Ti, Cr, V, Hf, Nb, Zr, Fe, Co, Ni, Cu, Pt, Au, Ag, Rh, Ir, Os, Re, B, Al, or alloy thereof, or nitride thereof, and has a wall thickness between 1.5 nm and 5.0 nm.

4. The magnetoresistive element of claim 1, wherein said insulating medium comprises at least one layer of oxide or nitride, preferred to be selected from the group consisting of MgO, $MgAl_2O_4$, $Al_2O_3$, $HfO_2$, $ZrO_2$, $TiO_2$, $SiO_2$, $Y_2O_3$, RuO, OsO, TcO, ReO, BeO, SiN, RuN, OsN, TcN, ReN, NiO, CoO, FeO, $FeCoO_2$, $NiFeO_2$, $CoNiO_2$, MnO, CrO, VO, TiO, ZnO and CdO.

5. The magnetoresistive element of claim 1, wherein said second resistance-area product ($RA_2$) is at least 5 times said first resistance-area product ($RA_1$).

6. The magnetoresistive element of claim 1, wherein said SOT material layer comprises a metal or metal alloy comprising one or more of Pt, Pd, Au, Ag and Cu, or comprises a metal or metal alloy comprising one or more of Pt, Pd, Au, Ag and Cu, doped with elements including one or more of Ir, Bi, Ti, S, Ta, W, Hf, Mo, Se, B, Sb, Re, La, C, P, La, As, Sc, O, Ga, Al, Y, In, Ce, Pr, Nd, F, Mn and Sr.

7. The magnetoresistive element of claim 6, wherein said SOT material layer further comprises a thin layer comprising one or more of Ir, Bi, Ti, S, Ta, W, Hf, Mo, Se, B, Sb, Re, La, C, P, La, As, Sc, O, Ga, Al, Y, In, Ce, Pr, Nd, F, Mn and Sr.

8. The magnetoresistive element of claim 1, further comprising a performance enhancement layer between said magnetic recording layer and said SOT material layer, wherein said performance enhancement layer comprises at least one layer of Ru, Mg, Mo, W, Ta, Ti, Cr, V, Hf, Nb, Zr, Fe, Co, Ni, Al, Cu, Pt, Au, Ag, Rh, Ir, Os, Re, or alloy thereof, or oxide thereof.

9. The magnetoresistive element of claim 1, wherein the vertical sidewall channel is exclusively located atop a first edge of the SOT material layer and on a first vertical side of the insulating medium, forming a first segment of an electric current path inside the magnetoresistive element, directly from the protective cap layer to the first edge of SOT material layer, wherein the electric current path inside the magnetoresistive element further comprises: a second segment horizontally from the first edge of the SOT material layer to the rest of the SOT material layer, and a third segment from the SOT material layer to the magnetic recording layer, the tunnel barrier layer, and the magnetic reference layer, sequentially.

10. A method of manufacturing a magnetoresistive element having a sidewall-current-channel (SCC) structure and being used in a magnetic memory device, the method comprising the steps of:
    providing a bottom electrode;
    depositing an MTJ stack over the bottom electrode, wherein the MTJ stack comprises at least a magnetic reference layer, a tunnel barrier layer provided on a top surface of the magnetic reference layer and a magnetic recording layer provided on a top surface of the tunnel barrier layer;

depositing an SOT material layer over the MTJ stack, the SOT material layer exhibiting the Spin Hall Effect;

depositing an insulating medium layer over the SOT material layer, the insulating medium layer comprising an electrically insulating material;

depositing a protective cap layer over the insulating medium layer;

depositing a hard mask layer over the protective cap layer;

conducting a photolithographic process to form a patterned hard mask having an opening exposed area on the protective cap layer;

first etching the protective cap layer and the insulating medium layer not covered by the patterned hard mask;

forming a conductive encapsulation layer on the top surface of the patterned hard mask, on the top surface of the etched insulating medium layer and on sidewalls of the insulating medium layer, the protective cap layer and the hard mask, wherein the conductive encapsulation layer is made of an electrically conductive material;

second etching away the conductive encapsulation layer on horizontal surfaces, and on a portion of vertical sides of the insulating medium layer, leaving the remaining conductive encapsulation layer being a conductive medium on at least one vertical side of the insulating medium layer, the protective cap layer and the hard mask, wherein the conductive medium forms a vertical sidewall channel electrically connecting the SOT material layer and the protective cap layer;

third etching the SOT material layer and the MTJ stack to form a plurality of MTJ cells; and forming a dielectric encapsulation layer on the top surface of the patterned hard mask and on sidewalls of the MTJ stack and the conductive encapsulation layer, wherein the dielectric encapsulation layer is made of an electrically insulating material.

11. The method of claim 10, wherein said conductive medium comprises at least one layer of metal or metal alloy or conductive metal nitride material, preferred to be Ru, Mo, W, Ta, Ti, Cr, V, Hf, Nb, Zr, Fe, Co, Ni, Cu, Pt, Au, Ag, Rh, Ir, Os, Re, B, Al, or alloy thereof, or nitride thereof.

12. The method of claim 10, wherein said insulating medium layer has a thickness of at least 12 angstroms and comprises at least one layer of oxide or nitride, preferred to be selected from the group consisting of MgO, $MgAl_2O_4$, $Al_2O_3$, $HfO_2$, $ZrO_2$, $TiO_2$, $SiO_2$, $Y_2O_3$, RuO, OsO, TcO, ReO, BeO, SiN, RuN, OsN, TcN, ReN, NiO, CoO, FeO, $FeCoO_2$, $NiFeO_2$, $CoNiO_2$, MnO, CrO, VO, TiO, ZnO and CdO.

13. The method of claim 10, wherein said SOT material layer is made from one or more materials that exhibit the Spin Hall Effect to a thickness from 1.5 nm to 10 nm, preferred to be selected from the group consisting of Pt, Pd, Au, Ag, Cu, or alloys thereof, or alloys thereof being doped with Ta, W, Hf, Ir, Bi, Se or oxygen, or a noble metal being doped with Ta, W, Hf, Ir, Bi, Se or oxygen, or combinations thereof.

14. The method of claim 10, wherein said first etching stops at a bottom surface of said insulating medium layer, or inside said SOT material layer, or within a lower-half portion of said insulating medium layer.

15. The method of claim 10, further comprising, after forming said conductive encapsulation layer, forming a sacrificial encapsulation layer of a dielectric material, the dielectric material is preferred to be at least one selected from the group consisting of $SiN_x$, $SiO_2$, $SiO_xN_y$, SiC, SiCN and amorphous Carbon.

16. The method of claim 10, wherein said second etching comprises a vertical etching using collimated reactive ion beam or collimated ion beam to remove said conductive encapsulation layer on horizontal surfaces, and a canted etching using collimated reactive ion beam or collimated ion beam to remove said conductive encapsulation layer on a portion of vertical sides of the insulating medium layer.

17. The method of claim 10, further comprising, after depositing said MTJ stack, forming a performance enhancement layer, wherein said performance enhancement layer comprises at least one layer of Ru, Mg, Mo, W, Ta, Ti, Cr, V, Hf, Nb, Zr, Fe, Co, Ni, Al, Cu, Pt, Au, Ag, Rh, Ir, Os, Re, or alloy thereof, or oxide thereof.

18. The method of claim 10, further comprising, after forming said dielectric encapsulation layer, refilling a dielectric layer, conducting a CMP process and forming a top electrode.

19. A method of manufacturing a magnetoresistive element having a sidewall-current-channel (SCC) structure and being used in a magnetic memory device, the method comprising the steps of:

providing a bottom electrode;

depositing an MTJ stack over the bottom electrode, wherein the MTJ stack comprises at least a magnetic reference layer, a tunnel barrier layer provided on a top surface of the magnetic reference layer, and a magnetic recording layer provided on a top surface of the tunnel barrier layer;

depositing an SOT material layer over the MTJ stack, the SOT material layer exhibiting the Spin Hall Effect;

depositing an insulating medium layer over the SOT material layer, the insulating medium layer comprising an electrically insulating material;

depositing a protective cap layer over the insulating medium layer;

depositing a hard mask layer over the protective cap layer;

conducting a photolithographic process to form a patterned hard mask having an opening exposed area on the protective cap layer;

first etching the protective cap layer, the insulating medium layer, the SOT material layer, and the MTJ stack not covered by the patterned hard mask;

forming an insulating encapsulation layer on the top surface of the patterned hard mask, on the top surface of the etched insulating medium layer and on sidewalls of the MTJ stack, the SOT material layer, the insulating medium layer, the protective cap layer and the hard mask, wherein the insulating encapsulation layer is a conformal layer made of a dielectric material;

depositing a first dielectric layer over the insulating encapsulation layer;

conducting a first CMP process and stopping at the top surface of the patterned hard mask;

second etching the insulating encapsulation layer and the first dielectric layer not covered by the patterned hard mask, and stopping at a vertical level being higher than a top surface of the magnetic recording layer and exposing at least a top portion of the SOT material layer;

forming a conductive encapsulation layer on the top surface of the patterned hard mask, on the top surface of the etched insulating encapsulation layer and the etched first dielectric layer and on sidewalls of the SOT material layer, the insulating medium layer, the protective cap layer and the hard mask, wherein the conductive encapsulation layer is made of an electrically conductive material;

third etching away the conductive encapsulation layer on horizontal surfaces, and on a portion of vertical sides of the insulating medium layer, leaving the remaining conductive encapsulation layer being a conductive medium on at least one vertical side of the SOT material layer, the insulating medium layer, the protective cap layer and the hard mask, wherein the conductive medium forms a vertical sidewall channel electrically connecting the SOT material layer and the protective cap layer;

depositing a second dielectric layer;

conducting a second CMP process; and forming a top electrode.

20. The method of claim 19, further comprising, after depositing said MTJ stack, forming a performance enhancement layer, wherein said performance enhancement layer comprises at least one layer of Ru, Mg, Mo, W, Ta, Ti, Cr, V, Hf, Nb, Zr, Fe, Co, Ni, Al, Cu, Pt, Au, Ag, Rh, Ir, Os, Re, or alloy thereof, or oxide thereof.

\* \* \* \* \*